(12) United States Patent
Merkl et al.

(10) Patent No.: US 6,218,727 B1
(45) Date of Patent: Apr. 17, 2001

(54) WAFER FRAME

(75) Inventors: Reinhold Merkl, Richmond, VA (US);
Detlef Houdeau, Langquaid (DE);
Harald Lösch; Marianne Lösch, both of Müchen (DE)

(73) Assignee: Infineon Technologie AG, Munich (DE)

( * ) Notice: Subject to any disclaimer, the term of this patent is extended or adjusted under 35 U.S.C. 154(b) by 0 days.

(21) Appl. No.: 09/246,745

(22) Filed: Feb. 8, 1999

Related U.S. Application Data

(63) Continuation of application No. PCT/DE97/01676, filed on Aug. 7, 1997.

(51) Int. Cl.⁷ .......................... H01L 23/495; H01L 23/29
(52) U.S. Cl. .................. 257/677; 257/794; 257/678; 257/792
(58) Field of Search ..................... 257/677, 794, 257/678, 792; 438/33, 123, 48, 57, 68, 106, 110, 113, 114, 460, 462

(56) References Cited

U.S. PATENT DOCUMENTS 4,680,617 * 7/1987 Ross ........................... 257/794

FOREIGN PATENT DOCUMENTS 4-04145638 * 5/1992 (JP).

* cited by examiner

*Primary Examiner*—Mahshid Saadat
*Assistant Examiner*—Jhihan B. Clark
(74) *Attorney, Agent, or Firm*—Herbert L. Lerner; Laurence A. Greenberg; Werner H. Stemer

(57) ABSTRACT

A wafer frame for fixing and handling 200 mm wafers is produced with a significantly reduced weight as compared to a metal wafer frame, while maintaining mechanical and thermal material properties. This is accomplished by producing the wafer frame from a plastic with a glass fiber content of from 1 to 40% by weight.

9 Claims, 1 Drawing Sheet

WAFER FRAME

CROSS-REFERENCE TO RELATED APPLICATION

This application is a continuation of copending International Application No. PCT/DE97/01676, filed Aug. 7, 1997, which designated the United States.

BACKGROUND OF THE INVENTION

FIELD OF THE INVENTION

The invention relates to a wafer frame for accommodating disk-shaped thin semiconductor wafers, which generally have a round structure. Such wafer frames, in which wafers have been fitted, are conveyed, for example, in a cassette one above the other in trays and are fed to appropriate treatment stations.

For example, photolithographic and etching structuring work is carried out on semiconductor wafers, to produce semiconductor chips. A multiplicity of semiconductor chips are present on a wafer. During the structuring work on the wafer, active regions on the wafer, which later form the individual chip, are spaced apart by a predetermined grid, so that zones or lines are produced along which the wafer can be cut. A process which is customarily used for that purpose is what is known as abrasive cutting using a high-speed diamond wheel.

In order to carry out that process, the wafer is held and guided in an accurate position using a vacuum device. For that purpose, a wafer frame is initially covered on the top side with a film. The wafer is placed with its unstructured side downward on the top of the film. That prevents mechanical damage to the individual chips which are present after the cutting. The vacuum device is applied to the film centrally from below through a central passage of the wafer frame, and the wafer or wafer and film are sucked on and locked in place. The cutting depth during the abrasive cutting is selected in such a way that the wafer is approximately or entirely cut through and the cutting depth penetrates slightly into the film.

The diameters of the wafers are being constantly increased in order to optimize the production processes as a whole. While previously the diameters were 4, 5 or 6 inches, nowadays wafers with a diameter of 8 inches are being used (1 inch=2.54 cm). Thus it is necessary to convey and treat wafers with a diameter of approximately 200 mm. Heretofore, in microelectronics mounting technology a metal wafer frame has been used to fix and handle such wafers.

SUMMARY OF THE INVENTION

It is accordingly an object of the invention to provide a wafer frame, which overcomes the hereinafore-mentioned disadvantages of the heretofore-known devices of this general type and which considerably facilitates handling while satisfying the same quality requirements with regard to moisture uptake, flexural strength and heat resistance.

With the foregoing and other objects in view there is provided, in accordance with the invention, a wafer frame for accommodating and conveying semiconductor wafers in microelectronics mounting technology, comprising a plate-like base body formed of a plastic with a glass fiber content of from 1 to 40% by weight, the base body having a central circular passage formed therein for accommodating a film and a wafer placed on the film.

The invention is based on the recognition that a suitable plastic is able to achieve improved materials properties if a certain glass fiber content is added. This may, for example, have a beneficial effect on the modulus of elasticity, the flexural strength and the heat resistance.

The requirements are, for example, as follows:

heat resistance: $\geq 120°$ C. according to Martens, Vicat moisture uptake: $\leq 0.8\%$ in accordance with American standard at 23° C.

flexural strength: $\geq 120$ Mpa (measured at 23° C.)

flexural modulus of elasticity: 10,000–18,000 $N/mm^2$ (measured at 23° C.)

If a plastic wafer frame is used, the result is a weight saving of 48 to 58% as compared to a metal wafer frame. The plastic wafer frame satisfies the technical requirements since a glass fiber content is added to the mixture. Glass fiber content is intended to mean a pulverulent substance including small pieces or rods of glass fiber.

In accordance with another feature of the invention, the plastic is a polyphenylene sulfone (PPS), a polyether sulfone (PES) or a polyether ether ketone (PEEK).

In accordance with a further feature of the invention, the glass fiber content lies in a range from 20 to 40% by weight.

In accordance with a concomitant feature of the invention, the plastic is a liquid crystal polymer (LCP) and the glass fiber content may lie in a range from 1 to 20% by weight.

Other features which are considered as characteristic for the invention are set forth in the appended claims.

Although the invention is illustrated and described herein as embodied in a wafer frame, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
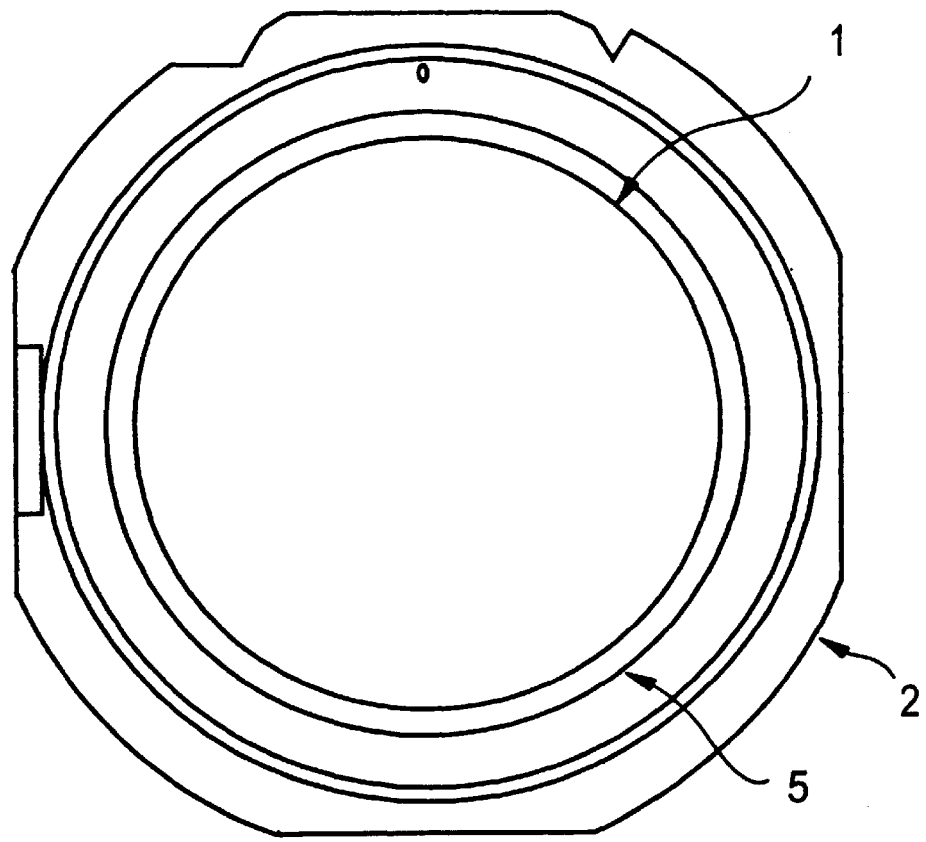
FIG. 1 is a fragmentary, diagrammatic, plan view of a wafer frame, indicating ratios between the wafer frame, a passage and a wafer.
Figure 2:
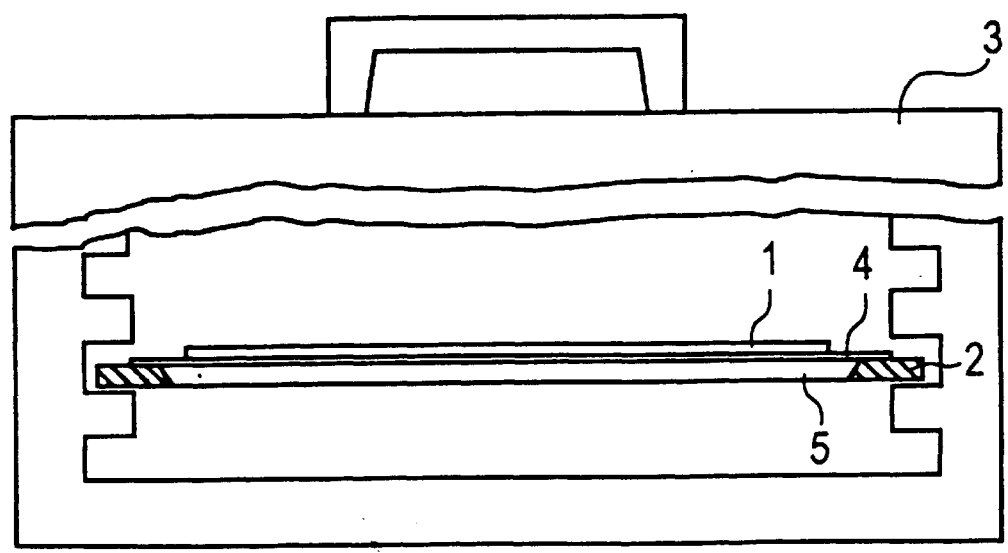
FIG. 2 is a fragmentary, partly-sectional, side-elevational view of a cassette for accommodating a multiplicity of wafer frames.

Referring now in detail to FIGS. 1 and 2 of the drawings as a whole, there is seen a proposal according to the invention for a wafer frame having a plate-like base body which is made from plastic and is able to accommodate wafers with a diameter of 200 mm. Fixing and handling wafers with a diameter of this nature (8 inches=200 mm) for treatment in microelectronics mounting technology entails technical changes, since the wafer frames have heretofore been produced from metal. For example, in order to be suitable for larger wafers while maintaining other existing peripheral conditions, a cassette 3 which contains, for example, 25 wafer frames 2, each with a film 4 and a wafer 1 placed thereon, would result in a highly unmanageable weight if the wafer frames were to be made from metal. If the weight of one metal wafer frame on this order of magnitude is approximately 160 g, the use of a stable and heat-resistant plastic makes it possible to reduce the weight by up to 58%. The plastic wafer frame is also able to satisfy the technical requirements relating to the mechanical and high-temperature load requirements. Some of those are included in the Deutsche Industrie Norm [German Industrial Standard] or in the standards for American Standardization for Mechanical Engineering.

FIG. 1 shows a plan view of the wafer frame 2 with a central circular passage 5. The positioning of a wafer 1 is also indicated. The external diameter of the wafer frame 2 is, for example, 296 mm and the diameter of the passage 5 is, for example, 250 mm.

FIG. 2 shows the cassette 3 which has an inner stepped grid that is able to accommodate a plurality of wafer frames 2 which are pushed in from the side. The wafers 1 are conveyed between different manufacturing stations by using this cassette 3. They are successively supplied for appropriate treatment processors at a manufacturing station. In FIG. 2, the self-adhesive plastic film 4 is applied to the wafer frame 2 and the wafer 1 is positioned centrally on the film 4. The diameter of the wafer 1 is smaller than the diameter of the passage 5. This ensures that a so-called vacuum chuck used for fixing by suction can be guided through the wafer frame 2 from below and indirectly holds the wafer 1 through the film 4.

A plastic according to the invention with a glass fiber content of up to 40% fulfills all of the material requirements for use in a plate-like base body of the wafer frame 2. The average glass fiber content is 20 to 40% for the plastics polyphenylene sulfone (PPS), polyether sulfone (PES) and for polyether ether ketone (PEEK). Admixtures for liquid crystal polymers (LCP) are advantageously between 1 and 20%. Those materials are known under various trade names and are marketed in Germany, for example, by the companies BASF-Ludwigshafen, Bayer-Leverkusen and DuPont-Bad Homburg.

We claim:

1. A wafer frame for accommodating and conveying semiconductor wafers in microelectronics mounting technology, the wafer frame comprising:

a plate-like base body formed of a plastic with a glass fiber content of from 1 to 40% by weight, said base body having a central circular passage formed therein for accommodating a film and a wafer placed on the film.

2. The wafer frame according to claim 1, wherein said plastic is a polyphenylene sulfone (PPS).

3. The wafer frame according to claim 1, wherein said plastic is a polyether sulfone (PES).

4. The wafer frame according to claim 1, wherein said plastic is a polyether ether ketone (PEEK).

5. The wafer frame according to claim 1, wherein said plastic is a liquid crystal polymer (LCP).

6. The wafer frame according to claim 2, wherein said glass fiber content lies in a range from 20 to 40% by weight.

7. The wafer frame according to claim 3, wherein said glass fiber content lies in a range from 20 to 40% by weight.

8. The wafer frame according to claim 4, wherein said glass fiber content lies in a range from 20 to 40% by weight.

9. The wafer frame according to claim 7, wherein said glass fiber content lies in a range from 1 to 20% by weight.

* * * * *